United States Patent [19]

Cho

[11] 3,941,624
[45] Mar. 2, 1976

[54] SN-DOPED GROUP III(A)-V(A) GA-CONTAINING LAYERS GROWN BY MOLECULAR BEAM EPITAXY

[75] Inventor: Alfred Yi Cho, New Providence, N.J.

[73] Assignee: Bell Telephone Laboratories, Incorporated, Murray Hill, N.J.

[22] Filed: Mar. 28, 1975

[21] Appl. No.: 563,078

[52] U.S. Cl. ......... 148/175; 156/610; 252/62.3 GA; 357/63
[51] Int. Cl.² ............... H01L 21/203; H01L 21/363
[58] Field of Search ............. 148/175; 252/62.3 GA; 156/610; 357/63

[56] References Cited
UNITED STATES PATENTS

| | | | |
|---|---|---|---|
| 3,612,958 | 10/1971 | Saito et al. | 148/175 X |
| 3,751,310 | 8/1973 | Cho | 148/175 |
| 3,839,084 | 10/1974 | Cho et al. | 148/175 X |

OTHER PUBLICATIONS

Davey et al., "Epitaxial GaAs Films Deposited by Vacuum Evaporation," J. Applied Physics, Vol. 39, No. 4, Mar. 1968, pp. 1941–1948.

Cho et al., "Molecular Beam Epitaxy of GaAs, $Al_xGa_{1-x}As$ and GaP," 1970 Symposium on GaAs, Paper No. 2, pp. 18–29.

Cho et al., "Epitaxy of Silicon Doped Gallium Arsenide by Molecular Beam Method," Metallurgical Trans., Vol. 2, Mar. 1971, pp. 777–780.

Cho et al., "Properties of Schottky . . . GaAs . . . . . . Epitaxial Layers," J. Applied Physics, Vol. 45, No. 3, Mar. 1974, pp. 1258–1263.

*Primary Examiner*—L. Dewayne Rutledge
*Assistant Examiner*—W. G. Saba
*Attorney, Agent, or Firm*—M. J. Urbano

[57] ABSTRACT

In order to insure that the doping profiles of Sn-doped Group III($a$)-V($a$) Ga-containing layers grown by molecular beam epitaxy follow relatively closely the time-intensity profile of the dopant beam, the substrate temperature should not exceed about 550°C.

5 Claims, 2 Drawing Figures

SN-DOPED GROUP III(A)-V(A) GA-CONTAINING LAYERS GROWN BY MOLECULAR BEAM EPITAXY

BACKGROUND OF THE INVENTION

This invention relates to molecular beam epitaxy (MBE) and, more particularly, to the MBE growth of Sn-doped Group III(a)-V(a) Ga-containing layers with abrupt doping profiles.

Many devices, such as FETs, IMPATTs, varactors, and microwave mixer diodes require precise control of layer thickness in the sub-micron range and close tolerance in carrier density of a predetermined doping profile. Such applications may require an abrupt change in doping concentration within a thin layer, typically only 1,000 Å thick. MBE has demonstrated the ability to achieve reproducibly layers of Group III(a)-V(a) compounds, most noteably GaAs, which are extremely smooth, ultra thin and have controllable doping profiles.

The basic MBE process is described by J. R. Arthur, Jr. in U.S. Pat. No. 3,615,931 issued on Oct. 26, 1971. Precise control of layer thickness in the sub-micron range is accomplished by the reduction of the growth rate and the ability to start and stop growth virtually instantaneously. The growth rate is governed primarily by the effusion cell temperature (i.e., the evaporation rate of Ga in the case of growing GaAs), and the sharpness of the interface between layers is governed by a mechanical shutter in front of the effusion cells which is used to interrupt the molecular beam abruptly. The nominal growth rate of MBE GaAs, for example, is about 1 $\mu$m/hr. With growth rates of this order, the shutter time is much less than the time for the growth of a monolayer. Since the epitaxial growth temperature for MBE is relatively low (450° to 650°C), as compared to liquid phase epitaxy (800°C) or the chemical vapor deposition (750°C), abrupt interfaces can be realized if diffusion and surface segregation are negligible.

From the standpoint of doping, it is pointed out in U.S. Pat. No. 3,751,310 issued on Aug. 7, 1973, that reliance on prior semiconductor technology in the determination of an appropriate dopant for MBE is generally misplaced. That patent explains for example that Zn, a common p-type dopant in other GaAs fabrication techniques, is unsuitable for MBE because of its low sticking coefficient at the usual growth temperatures. On the other hand, Sn and Si are identified as n-type MBE dopants whereas Ge is amphoteric depending on whether the surface structure is Ga-stabilized (p-type) or As-stabilized (n-type). Aside from Ge, magnesium is also a suitable MBE p-type dopant. Its sticking coefficient, which is relatively low on GaAs, increases dramatically if Al is incorporated in the layer to form AlGaAs (see, U.S. Pat. No. 3,829,084 granted to M. B. Panish and myself on Oct. 1, 1974).

SUMMARY OF THE INVENTION

In the course of fabricating by MBE some of the aforementioned devices requiring controlled abrupt doping profiles in thin GaAs layers, it was found that the doping profile of Sn-doped layers followed relatively closely the time-intensity profile (a rectangular pulse shape) of the dopant beam only when the substrate temperature did not exceed about 550°C. Above this substrate temperature, the doping profile tended to flatten out with increasing temperature. This effect is attributed to surface segregation of Sn during deposition.

In contrast, similar experiments performed with Si and Ge demonstrated that doping profiles closely followed the time-intensity profile of the dopant beam nearly independent of substrate temperatures within the usual range.

For several reasons, however, Sn may be a preferred dopant. For instance, Sn-doped layers have a much higher photoluninescent intensity than similarly doped Si and Ge layers, a property of particular importance in optical devices such as low threshold double heterostructure (DH) junction lasers. Germanium, on the other hand, tends to produce highly compensated layers so that higher dopant beam intensities are required to reach a particular doping level. Silicon also tends to be compensated and, in addition, tends to change sites (between acceptor-donor pairs and/or pairs complexes) during subsequent heating steps and thereby disrupts the initially formed doping profile.

In accordance with the invention, therefore, where it is desired to grow by MBE Sn-doped GaAs layers in which the doping profiles follow relatively closely the time-intensity profile of the dopant beam (as with abrupt profiles in thin layers), the substrate temperature should be maintained less than about 550°C to avoid appreciable surface segregation of the Sn. For good crystal quality of the layers, however, the substrate temperature should exceed 450°C as taught in the prior art. Due to their highly similar chemical characteristics, the invention is also applicable generally to Ga-containing Group III(a)-V(a) compounds, especially AlGaAs, GaP and AlGaAsP.

BRIEF DESCRIPTION OF THE DRAWING

The invention, together with its various features and advantages, can be readily understood from the following more detailed description taken in conjunction with the accompanying drawing, in which.

DETAILED DESCRIPTION

MBE apparatus and substrate preparation are well known in the art and in the interests of simplicity will not be repeated in detail here. In this regard, reference is made, for example, to the aforementioned Arthur and Cho patents as well as two publications by Cho et al: Jour. Appl. Phys., Vol. 45, p. 1,258 (1974) and Jour. Appl. Phys., Vol. 45, p. 1,812 (1974).

Briefly, however, the general MBE technique as taught in prior art entails placing a monocrystalline substrate in an evacuable chamber, reducing the background pressure to a subatmospheric pressure (e.g., $10^{-8}$ Torr), heating the substrate to a temperature in the range of about 450° to 650°C, and directing at least one molecular beam containing the constituents of the desired epitaxial layer at the substrate for a time period effective to grow the layer to a predetermined thickness. This process was used in the following experiments.

The substrate was (100) GaAs mounted on a molybdenum heating block which could be heated up to 700°C. The substrate temperature was determined by a chromel-alumel thermocouple imbedded in the center of the heating block. To assure intimate contact of the substrate to the block and no edge cooling due to metal clamps holding the substrate, no clamps were used. The substrate was simply held in thermal contact with the block by a thin layer of indium. It was found that the surface tension of indium was able to hold the substrate in either a vertical or horizontal position even when heated to over 600°C. When the substrate was mounted in this manner, uniform heating was achieved over the entire substrate and strain-induced dislocation lines in the epitaxial layer, which would have been produced if clamps had been used, were eliminated.

GaAs layers were prepared at various substrate temperatures between 500°C and 615°C. Doping profiles were formed using Sn, Si and Ge dopant beams. The time-intensity profile of the dopant beam was a rectangular pulse formed by simply opening and closing the shutter in front of the gun (effusion cell) containing the dopant. Another gun containing the same dopant was used to produce the background levels B1 and B2 in FIGS. 1 and 2, respectively. The measurements of the doping profiles first entailed the formation of Schottky barriers on the epitaxial layer surface. The wafers were cleaned with trichloroethane, acetone, and methanol, then etched in HCl for 20 seconds, and finally rinsed in methanol and blown dry by a jet of freon. Three thousand Angstroms of Au were deposited through a Mo mask consisting of arrays of 2, 5, 10 and 20 mil diameter holes. The samples were then measured with a well-known differential capacitance feedback profiler. The resolution of the profiler when measuring abrupt changes in carrier distribution was less than a few Debye lengths. In the case of GaAs for carrier concentrations of $10^{16}/cm^3$ and $10^{17}/cm^3$, the Debye lengths are 430 A and 136 A, respectively.

Sn-Doped GaAs Layers

Figure 1:
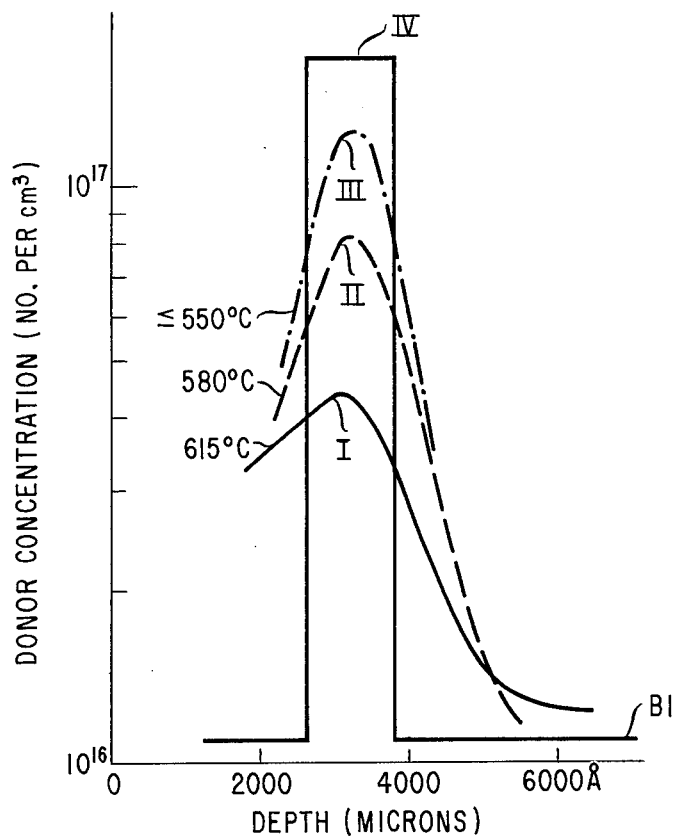
FIG. 1 compares a measured carrier profile of Sn-doped GaAs layers grown at different substrate temperatures (curves I, II, III) with an ideal impurity atom profile (curve IV), calculated from the dopant beam intensity.

In the case of doping with Sn, a step change of dopant intensity in the Sn molecular beam resulted in a much slower change in the actual doping profile in the epitaxial layer. This doping profile also varied as a function of the growth temperature. A higher substrate temperature during deposition produced a larger deviation from the profile of the dopant intensity in the beam. Curves I, II and III of FIG. 1 show the measured Sn doping profile of several GaAs samples when the layers were grown at temperatures of 615°C, 580°C and ≤ 550°C, respectively, but with the same growth rate and same intensity of the dopant beam pulse. The rectangular curve IV represents the calculated doping profile of a GaAs layer if unity sticking coefficient of the Sn dopant is assumed and surface segregation, bulk diffusion, and majority carrier diffusion are neglected. Notice that the actual measured doping profiles show increased deviation from the ideal rectangular profile as the growth temperature increases. For substrate temperatures between 500°C and 550°C the measured profile did not change substantially and tended to duplicate curve III. It is expected that curve III is representative of results which would be achieved for substrate temperatures ranging from 450° to 500°C. Note also, for a growth temperature of 615°C, the resulting doping profile became asymmetric. The carrier concentration decreased monotonically after the dopant beam was cut off.

Numerous devices having profiles of the type shown in FIG. 1, Curve III were fabricated. The thicknesses of the layers having an abrupt profile, of the type shown in Curve III, ranged from about 350 A to 3000 A.

Figure 2:
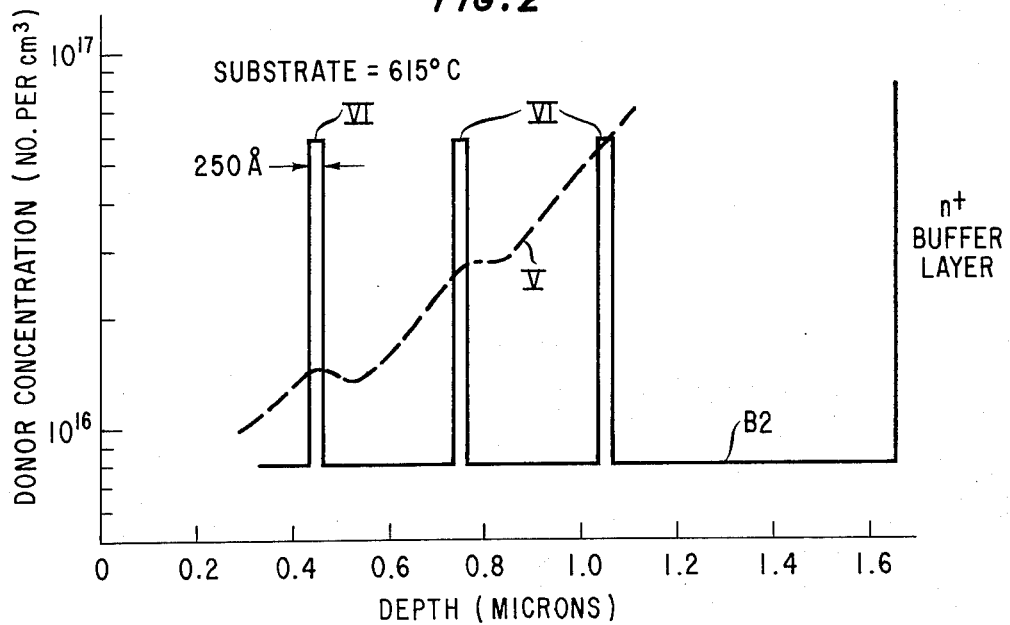
FIG. 2 compares a measured carrier profile of a Sn-doped GaAs layer grown at a fixed substrate temperature (curve V) with an ideal impurity atom profile (curve VI) calculated from the dopant beam intensity.

A more extreme illustration of this effect is shown in FIG. 2. Deposition was carried out at a substrate temperature of 615°C. An $n^+$-GaAs buffer layer doped with Sn to $2 \times 10^{18}/cm^3$ was grown on the substrate first. The buffer layer growth was terminated when the Sn beam intensity was abruptly reduced at about 1.6 $\mu m$ from the surface. As shown by curve VI, three narrow pulses of Sn were then injected into the growing GaAs layer, each for a duration of time equivalent to the growth of 250 A of GaAs. The resulting doping profile (curve V) showed nearly unresolved peaks of the carriers on a rising background from the $n^+$ buffer layer. It is speculated that the inability to resolve the peaks, as well as the asymmetric shape of the peaks when layers are grown at the higher substrate temperature, may be attributed to a surface segregation effect. Although the Sn atoms/molecules have a sufficiently long adsorption lifetime on the substrate surface, they apparently tend to segregate on top of the growing surface without readily being incorporated into the growing layer. The competing processes of surface segregation and incorporation are strongly influenced by the substrate temperature with segregation increasing with temperature, particularly above about 550°C.

Consistent with this observation is the fact that as the temperature is increased, the growth conditions tend toward equilibrium and the increased segregation at higher temperature simply reflects the distribution coefficient for Sn between unincorporated Sn on the surface and that in the growing layer at equilibrium. The asymmetric peak shape with growth at 615°C was therefore due to Sn remaining on the surface from the previous deposition even after the Sn beam had been cut off. The depletion of the Sn on the surface is finally accomplished by re-evaporation from the surface and incorporation of Sn into the layer.

From an optical device standpoint it should be noted that the photoluminescent (PL) intensity of Sn-doped GaAs layers peaks when the layers are grown at substrate temperatures of about 560°C. Therefore, if both high PL intensity and abrupt profiles are desired, the substrate temperature should be at the upper end of the 450° to 550°C range described herein.

Ge and Si Doped Layers

Quite different doping characteristics were observed when GaAs layers were doped with Si and Ge beams. Measurements were made from different Schottky barrier diodes along a 2 cm length of the GaAs substrate. Sharp symmetrical doping profiles which followed closely the pulse shape of the dopant beam were achieved with Si and Ge even when the substrate was heated to over 600°C during deposition.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

What is claimed is:

1. A molecular beam epitaxy technique for fabricating layers of Ga-containing Group III($a$)-V($a$) compounds with abrupt doping profiles which follow relatively closely the time-intensity profile of a dopant beam, comprising the steps of:
   a. placing a substrate in an evacuable chamber;
   b. reducing the background pressure in the chamber to a subatmospheric pressure;
   c. preheating said substrate to a temperature in the range of about 450° to 650°C,
   d. directing at least one molecular beam containing Ga and the other constituents of said compound at said substrate for a time period effective to grow said layer to a desired thickness;
   e. during step (d) directing another molecular beam containing a dopant at said substrate to produce a predetermined doping profile in said layer; characterized in that:
      1. said dopant is Sn;
      2. said substrate temperature is maintained in the range of about 450° and 550°C so that surface segregation effects of Sn atoms/molecules are alleviated and said doping profile substantially follows the time-intensity profile of said another beam of step (e).

2. The technique of claim 1 wherein said another molecular beam has a time-intensity profile in the shape of a rectangular pulse.

3. The technique of claim 2 wherein said other constituents of said one molecular beam include As.

4. The technique of claim 3 wherein said substrate comprises GaAs.

5. The technique of claim 4 wherein said substrate is heated to a temperature in the range of about 500° to 550°C.

* * * * *

UNITED STATES PATENT AND TRADEMARK OFFICE
CERTIFICATE OF CORRECTION

PATENT NO. : 3,941,624
DATED : March 2, 1976
INVENTOR(S) : Alfred Y. Cho

It is certified that error appears in the above-identified patent and that said Letters Patent are hereby corrected as shown below:

Column 2, line 18, after "and/or" change "pairs" to

--between--.

Signed and Sealed this twenty-ninth Day of June 1976

[SEAL]

Attest:

RUTH C. MASON
Attesting Officer

C. MARSHALL DANN
Commissioner of Patents and Trademarks